United States Patent [19]

Hoshino

[11] Patent Number: 4,658,364
[45] Date of Patent: Apr. 14, 1987

[54] SIGNAL PROCESSING APPARATUS

[75] Inventor: Takehiko Hoshino, Oomiya, Japan

[73] Assignee: The Nippon Signal Co., Limited, Tokyo, Japan

[21] Appl. No.: 686,825

[22] Filed: Dec. 27, 1984

[51] Int. Cl.$^4$ ............................................. H03K 5/20
[52] U.S. Cl. ................................. 364/484; 328/154; 328/140; 364/724
[58] Field of Search ............... 364/484, 724; 328/138, 328/139, 140, 152, 154; 375/103; 324/78 F, 78 R; 307/522

[56] References Cited

U.S. PATENT DOCUMENTS

| | | | |
|---|---|---|---|
| 3,501,704 | 3/1970 | Teitelbaum et al. | 328/154 |
| 3,522,449 | 8/1970 | McMurtrie | 328/154 |
| 3,805,171 | 4/1974 | Drumheller | 328/152 |
| 4,031,506 | 6/1977 | Siems | 328/154 |
| 4,110,834 | 8/1978 | Altwein | 364/484 |
| 4,368,434 | 1/1983 | Miller et al. | 328/140 |

Primary Examiner—Parshotam S. Lall
Attorney, Agent, or Firm—Bucknam and Archer

[57] ABSTRACT

A signal processing apparatus has a novel arrangement wherein the frequency of each input signal is multiplied or divided in a frequency converter circuit whose multipliers or divisors are changed sequentially and repeatedly by a control circuit. The signal thus converted with respect to its frequency is fed to a common processing circuit, whose output signal is then discriminated selectively by a control signal synchronized with change of the multipliers or divisors in the frequency converter circuit, thereby providing an output signal representative of the frequency of the signal being inputted. With this arrangement, it becomes possible to use in common the processing circuit comprising a band-pass filter, a level detector and a rectifier.

5 Claims, 8 Drawing Figures

SIGNAL PROCESSING APPARATUS

BACKGROUND OF THE INVENTION

1. Field of the Invention

The present invention relates to a signal processing apparatus for selectively discriminating various input signals of different frequencies in the waveform of rectangular pulses with binary truth values of "1" and "0" or in the waveform of general alternating current and processing an output signal to specify the frequency and kind of each input signal. And more particularly, it relates to an apparatus capable of multiplying or dividing the frequency of each input signal and producing, through a band-pass filter, an output signal to specify the frequency of the input signal.

2. Prior Art

In the ordinary signal processing apparatus designed for selectively discriminating a variety of input signals of different frequencies and producing an output signal to specify the frequency of each input signal being actually received, it is generally customary that the input signals are introduced in parallel to a plurality of band-pass filters provided respectively in accordance with the kind of input signals and adapted to permit passage of signals of the corresponding frequencies so that the input signal being received is selectively discriminated with respect to the frequency thereof, and a rectifier circuit is provided in a stage posterior to each of the band-pass filters so as to rectify and smooth the output signal of the associated band-pass filter individually, thereby producing an output signal having binary truth values of "1" and "0".

However, since such signal processing apparatus needs to be equipped with a processing circuit including at least band-pass filters and rectifier circuits for the entire kind of input signals to be processed, it is unavoidable that the apparatus becomes expensive and dimensionally bulky. And another disadvantage has also been existent therefore that each band-pass filter comes to be large particularly in case the input signal thereto is in a low frequency range.

SUMMARY OF THE INVENTION

It is therefore an object of the present invention to provide an improved signal processing apparatus of a simplified structure which is capable of processing various input signals of different frequencies in a common processing circuit and producing an output signal to specify the frequency of the signal being inputted.

According to the present invention, a signal processing apparatus has a novel arrangement wherein the frequency of each input signal is multiplied or divided in a frequency converter circuit whose multipliers or divisors are changed sequentially and repeatedly by a control circuit. The signal thus converted with respect to its frequency is fed to a common processing circuit, whose output signal is then discriminated selectively by a control signal synchronized with change of the multipliers or divisors in the frequency converter circuit, whereby an output signal is produced to specify the frequency of the signal being inputted.

Many other advantages and features of the present invention will become manifest to those versed in the art upon making reference to the detailed description and the accompanying sheets of drawings in which preferred structural embodiments incorporating the principles of the present invention are shown by way of illustrative example.

DETAILED DESCRIPTION

Figure 1:
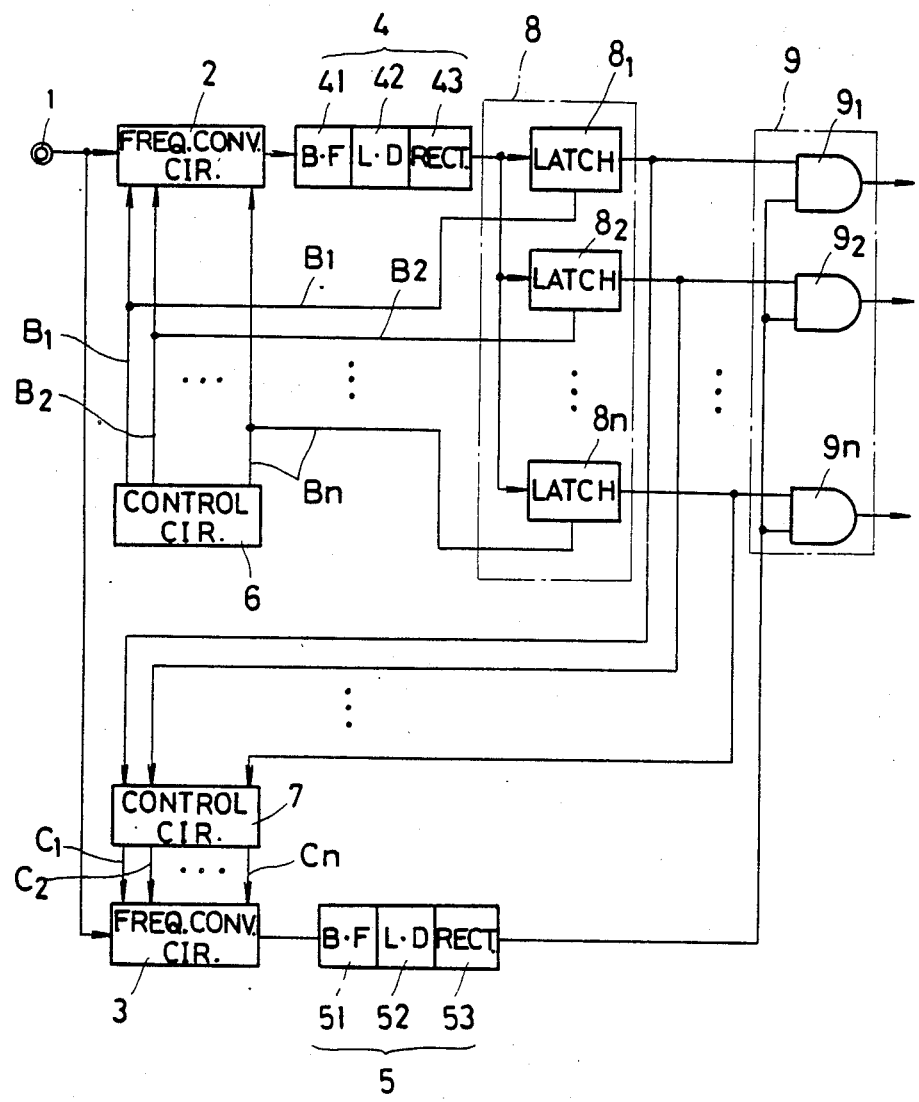
FIG. 1 is a block diagram of an exemplary signal processing apparatus embodying the present invention.

FIG. 1 shows a block diagram of a signal processing apparatus constructed in accordance with the present invention to selectively discriminate n kinds of rectangular-wave input signals A1, A2—An of frequencies F1, F2—Fn, wherein at least one of such input signals A1, A2—An is fed to a terminal 1.

The input signal at the terminal 1 is then introduced in parallel to first and second frequency converter circuits 2, 3 where frequency multiplication or division is executed, and the frequency-converted signal is inputted to first and second processing circuits 4, 5. The processing circuits 4, 5 have known configuration comprising band-pass filters 41, 51, level detectors 42, 52 such as Schmitt circuits to detect the levels of output signals of the band-pass filters 41, 51, and rectifier circuits 43, 53 for rectifying and smoothing the output signals of the level detectors 42, 52. The outputs of the two frequency converter circuits 2, 3 in the preceding stage are fed respectively to the band-pass filters 41, 51.

Each of the first and second frequency converter circuits 2, 3 serves to multiply or divide the input signal frequency. The multipliers or divisors of the first frequency converter circuits 2 are sequentially changed by control signals obtained from a first control circuit 6, while those of the second frequency converter circuit 3 are sequentially changed by control signals from a second control circuit 7. Each of the frequency converter circuits 2, 3 is constituted of a novel configuration which first converts the input signal into a digital form in a binary code or the like, then writes the converted signal in a random access memory RAM, subsequently reads out the written signal therefrom at a speed conforming to the control signal, and converts the read signal into an analog signal form to produce an output.

The signal fed from the first control circuit 6 to the first frequency converter circuit 2 are n kinds of control signals B1, B2—Bn which correspond respectively to the n kinds of input signals A1, A2—An fed to the terminal 1 and are outputted sequentially and repeatedly. As a result, the first frequency converter circuit 2 is so controlled that the multipliers or divisors thereof are changed sequentially and repeatedly to numbers N1, N2—Nn corresponding respectively to the n kinds of signals A1, A2—An.

The multipliers or divisors N1, N2—Nn in the first frequency converter circuit 2 are selectively established in such a manner that, after frequency conversion of the individual signals, each of the multiplied or divided frequencies N1.F1, N2.F2—Nn.Fn becomes coincident with the center frequency of the band-pass filter 41. Therefore, when a signal A1 for example is fed as an input to the terminal 1, the frequency F1 of the signal A1 is multiplied or divided by N1 upon arrival of a control signal B1 each time and the resultant signal of a frequency N1.F1 is introduced to the filter 41 to pass therethrough. Consequently, a pulse signal of a frequency N1.F1 is produced from the level detector circuit 42 during the period of time from generation of one control signal B1 to generation of a next signal B2, so that the output of the rectifier circuit 43 comes to have a truth value "1" merely during the presence of such pulse signal being imputted thereto or to have a truth value "0" during the absence of the pulse signal. In case input signals to the terminal 1 are more than two in kind such as a composite of signals A1 and A2, a pulse signal is produced at the output terminal of the level detector circuit 42 in response to generation of control signals B1 and B2 each time, so that the output of the rectifier circuit 43 comes to have a truth value "1" merely during the presence of such pulse signals being inputted thereto and have a truth value "0" during any other period. Accordingly, when a plurality of signals are fed to the first frequency converter circuit 2, a resultant signal of a truth value "1" obtained at the output terminal of the first processing circuit 4 becomes a time division signal.

The first control circuit 6 capable of sequentially and repeatedly producing control signals B1, B2—Bn of a truth value "1", comprises a clock generator to generate clock pulses of a fixed frequency, and an n-bit ring counter driven in a stepping manner sequentially and repeatedly by such clock pulses. The output signals of the ring counter having a truth value "1" in each bit are usable as control signals B1, B2—Bn.

Provided on the output side of the first processing circuit 4 is a selector circuit 8 for producing a signal representing the frequency of the signal being fed to the first frequency converter circuit 2, and a discriminator circuit 9 is provided on the output side of the selector circuit 8 for evaluating the result of selection in the selector circuit 8.

The selector circuit 8 comprises n stages of latch circuits $8_1$, $8_2$—$8n$ corresponding respectively to the n kinds of signals A1, A2—An.

Each of the latch circuits $8_1$, $8_2$—$8n$ receives at its data terminal the output signal of the first processing circuit 4 and also the associated one of the control signals B1, B2—Bn as a timing signal individually and, in response to arrival of the control signals B1, B2—Bn each time, functions to latch the data of a truth value "1" or "0" obtained at the output terminal of the rectifier circuit 43.

The discriminator circuit 9 comprises n stages of two-input AND gates $9_1$, $9_2$—$9n$ associated respectively with the latch circuit $8_1$, $8_2$—$8n$ of the selector circuit 8. The AND gates $9_1$, $9_2$—$9n$ are connected individually to the latch circuits $8_1$, $8_2$—$8n$ and receive the outputs of the associated latch circuits at the imput terminals on one side while receiving in common the output of the second processing circuit 5 at the input terminals on the other side.

Out of n kinds of control signals C1, C2—Cn corresponding respectively to n kinds of signals A1, A2—An, those fed from the second control circuit 7 to the second frequency converter circuit 3 are related to the circuits latching a truth value "1". Therefore, in case merely a single circuit is latching a truth value "1", one corresponding control signal is outputted therefrom. However, when a plurality of circuits are latching a truth value "1", a plurality of corresponding control signals are outputted therefrom sequentially and repeatedly. Thus, in accordance with the control signals C1, C2—Cn fed from the second control circuit 7, multipliers or divisors in the second frequency converter circuit 3 are changed to numbers M1, M2—Mn which correspond respectively to n kinds of signals A1, A2—An.

The multipliers or divisors M1, M2—Mn in the frequency converter circuit 3 are selectively established in such a manner that, after frequency conversion of the individual signals, each of the multiplied or divided frequencies M1.F1, M2.F2—Mn.Fn becomes coincident with the center frequency of the band-pass filter 51.

Figure 2A:
FIGS. 2(a) to 2(f) show waveforms of electric signals processed in the apparatus of FIG. 1.
Figure 2B:
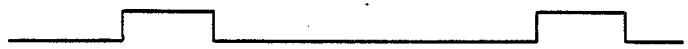
Figure 2C:
Figure 2D:
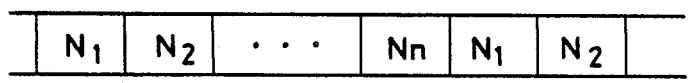
Figure 2E:
Figure 2F:
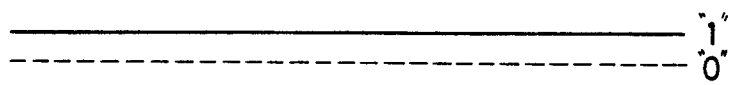

In the signal processing apparatus of the present invention where sequential generation of control signals from the first control circuit 6 is repeated as shown in FIG. 2(a), 2(b) and 2(c), the multipliers or divisors N1, N2—Nn in the first frequency converter circuit 2 are changed subsequently and repeatedly as shown in FIG. 2(d). Therefore, when the input to the terminal 1 is merely a signal A of a frequency F1, the output signal of the first frequency converter circuit 2 is converted to have a frequency N1.F1 upon generation of a control signal B1 each time and then is introduced to the band-pass filter 43 to pass therethrough, whereby the output signal of the first processing circuit 4 comes to have truth value "1" only during the presence of the control signal B1 and to have a truth value "0" at any other time as shown in FIG. 2(e). Since the output of the first processing circuit 4 becomes a truth value "1" in response to the control signal B1 fed thereto, the latch circuit $8_1$ latches a truth value "1" as shown in FIG. 2(f), while each of the other latch circuits $8_2$—$8n$ latches a truth value "0" obtained at the output of the first processing circuit 4 in response to the respectively corresponding control signals B2—Bn. Therefore the second control circuit 7 produces a control signal C1 to set a multiplier or divisor M1 in the second frequency converter circuit 3, so that a signal of a converted frequency M1.F1 is fed to the second processing circuit 5 and then is introduced to the band-pass filter 51, whereby a signal of a truth value "1" is outputted from the second processing circuit 5. Consequently, in the discriminator circuit 9, the output of the AND gate $9_1$ alone comes to have a truth value "1" which represents that the result of selection in the selector circuit 8 is corrected and the signal being inputted to the first frequency converter circuit 2 has a frequency F1.

When the input to the terminal 1 alters from a signal A1 of a frequency F1 to, for example, a signal A2 of a frequency F2, the first frequency converter circuit 2 produces, in response to arrival of a control signal B2 each time, a signal of a converted frequency (N2.F2) permitted to pass through the band-pass filter 41 in the first processing circuit 4, while the second processing circuit 4 produces a signal of a truth value "1". Accordingly, in the selector circuit 8, merely the lated circuit $8_2$ alone latches a truth value "1" while each of the other latch circuits latches a truth value "0". Therefore, the second control circuit 7 produces a control signal C2 to set a multiplier or divisor M2 in the second frequency converter circuit 3, so that the second processing circuit 5 produces an output signal of a truth value "1". Consequently, in the discriminator circuit 9, the output of the AND gate $9_2$ alone comes to have a truth signal "1" which represents that the result of selection in the selector circuit 8 is corrected and the signal inputted to the first frequency converter circuit 2 has a frequency F2.

In case the input to the terminal 1 is a composite of signals A1 and A2 respectively having frequencies F1 and F2, the output of the first processing circuit 5 comes to have a truth value "1" in response to arrival of control signal B1 and B2 each time in the same manner as the foregoing, so that the latch circuits $8_1$, $8_2$ in the selector circuit 8 latch a truth value "1" while any other latch circuit latches a truth value "0". Accordingly, the second control circuit 7 produces control signals B1 and B2 alternately to set multipliers or divisors M1, M2 alternately in the second frequency converter circuit 3, so that the second processing circuit 5 produces an output signal of a truth value "1". Consequently, the AND gates $9_1$, $9_2$ in the discriminator circuit 9 provide signals of a truth value "1" which represent that the result of selection in the selector circuit 8 is corrected and the signals being inputted to the first frequency converter circuit 2 have frequencies F1 and F2 respectively.

Now an exemplary configuration of the first frequency converter circuit 2 employing a RAM (random access memory) as storage means will be described below with reference to FIG. 3. It is to be understood that the second frequency converter circuit 3 may also have the same configuration as that of the first frequency converter circuit 2.

The frequency converter circuit 2 comprises, in addition to the above RAM 20, an A-D converter 21 for converting the output signal of a receiving circuit here, the terminal, into n-bit digital data, a switching circuit 22 located on the data input-output side of the RAM 20, another switching circuit 23 located on the address-signal input side of the RAM 20, a latch circuit 24 for latching the digital data outputted from the RAM 20 via the switching circuit 22, a D-A converter 25 for converting the latched digital data into analog data, a memory control circuit 26 for producing a write/read control signal W/R, a clock signal CP and two kinds of address signals ADW, ADR, an inverter 27 for inverting the write/read control signal W/R, and an AND gate 28 for outputting to the latch circuit 24 and AND signal which is a logical product of the inverter 27 and the clock signal CP.

The write/read control signal W/R is binary with truth values "1" and "0" to indicate a write mode and a read mode respectively. This signal is so formed as to have a truth value "1" for a predetermined period of time at a fixed frequency to indicate a write mode or to have a truth value "0" during any other period to indicate a read mode.

The frequency of the clock signal CP is changed sequentially and repeatedly to F1, F2—Fn in accordance with multipliers or divisors N1, N2—Nn corresponding to the frequencies read out from the RAM 20.

The RAM 20 has a storage capacity of L words x n bits, during the period of a truth value "0" of the write/read control signal W/R, the data stored in the memory area specified by the read address signal ADR are fed in sequence to the switching circuit 22 synchronously with stepping advance of the address signal ADR. And when the write/read control signal W/R is turned to have a truth value "1", the output of the switching circuit 22 is written in the memory area specified by the write address signal ADW.

In response to arrival of each write/read control signal W/R of a truth value "1", the A-D converter 21 converts the output signal of the receiving circuit 1 into digital data and outputs the same in parallel to the switching circuit 22. This circuit 21 is equipped with switches equal in number to the bits of digital data outputted in parallel from the A-D converter 21, and a common terminal $22_1$ of the individual switches is connected to a data input-output terminal of the RAM 20. One terminal $22_2$ of each switch is connected to an output terminal of the A-D converter 21, while the other terminal $22_3$ thereof is connected to an input terminal of the latch circuit 24. Normally the terminals $22_1$ and $22_3$ are closed to connect the RAM 20 with the latch circuit 24, but upon arrival of a write/read control signal W/R of a truth value "1", the terminals $22_1$ and $22_2$ are closed to connect the RAM 20 with the A-D converter 21.

The switching circuit 23 is equipped with switches equal in number to the bits of address signals ADW, ADR, and a terminal $23_1$ of each switch is connected to an address-signal input terminal of the RAM 20, while terminals $23_2$ and $23_3$ thereof are connected respectively to output terminals for the address signals ADW, ADR. Normally the terminals $23_1$ and $23_3$ are closed to feed the address signal ADR to the RAM 20, but upon arrival of a write/read control signal W/R of a truth value "1", the terminals $23_1$ and $23_2$ are closed to feed the address signal ADW to the RAM 20.

The memory control circuit 26 has, in addition to aforesaid function of outputting a write/read control signal W/R at a fixed frequency, more functions of outputting a write address signal ADW advanced synchronously with the write/read control signal W/R as well as outputting clock signals CP of frequencies F1 F2—Fn corresponding to control signals B1, B2—Bn or C1, C2—Cn fed from the control circuit 6 or 7 shown in FIG. 1, and further outputting a read address signal ADR advanced synchronously with such clock signals.

The frequency of the clock signal CP is changed from F1 through Fn at least once during one period of the write/read control signal W/R.

The memory control circuit 26 is constituted of, for example, a fixed-frequency pulse generator, a write frequency divider for demultiplying the frequency of the pulse signal obtained from the generator, a write address counter for counting the output signals of the frequency divider, n stages of frequency dividers for demultiplying the frequency of the pulse signal respectively by predetermined dividers N1, N2—Nn, n stages of two-input AND gates for gating the output signals of n stages of read frequency dividers by the use of control signals B1, B2—Bn, an OR gate for providing an OR signal which is a logical sum of the outputs of such AND gates, and a read address counter for counting the output signals of the OR gate. In such memory control circuit 26, the output signal of the write frequency divider is used as a write/read control signal W/R, the output signal of the write and read address counters as address signals ADW and ADR respectively.

Figure 3:
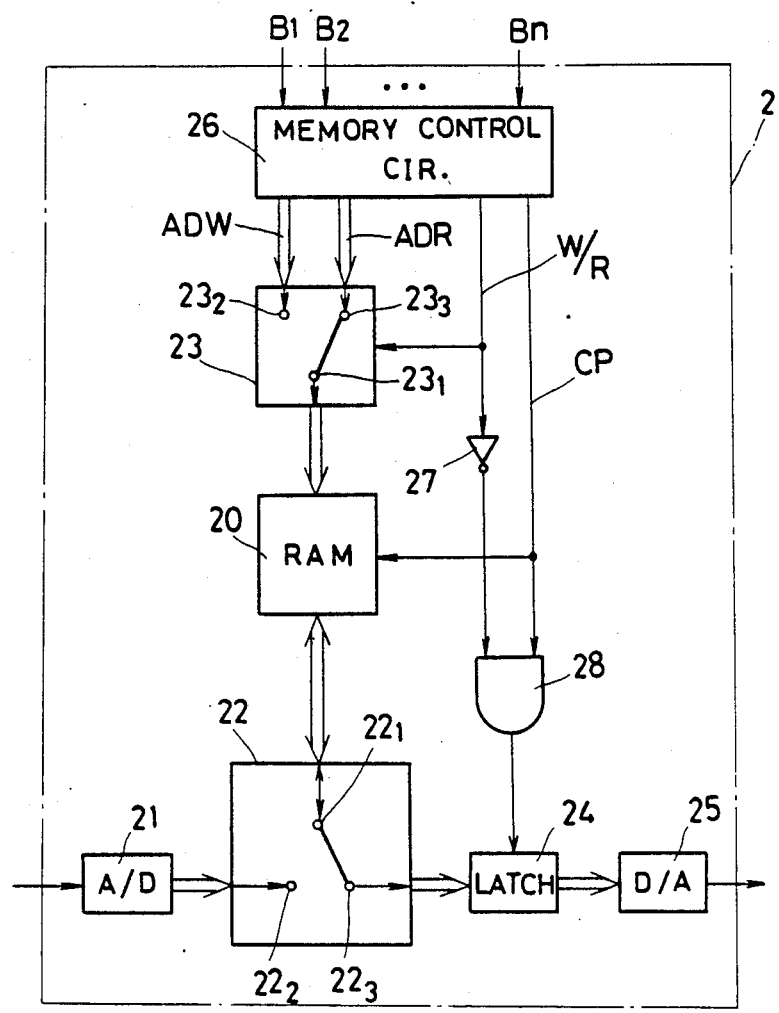
FIG. 3 shows an exemplary configuration of an frequency converter circuit.

With regard to the frequency converter circuit of FIG. 3 where normally the terminals $22_1$ and $22_3$ are closed in one switching circuit 22 and also the terminals $23_1$ and $23_3$ are closed in another switching circuit 23, when the write/read control signal W/R has a truth value "0", the date stored in the memory area specified by the address signal ADR are read out in sequence from the RAM 20 synchronously with stepping advance of the address signal ADR, and the digital date is latched by the latch circuit 24 in response to arrival of each clock signal CP from the AND gate 28. And when the write/read control signal W/R is turned to have a truth value "1", the terminals $22_1$ and $22_2$ are closed in the switching circuit 22 and also the terminals $23_1$ and $23_2$ are closed in the switching circuit $23_1$ so that the output of the A-D converter 21 is written in the memory area specified by the address signal ADW in the RAM 20. The latch circuit 24 repeats its operation of holding the preceding data during the write mode.

According to the present invention, as described above, the frequency of each input signal is multiplied or divided by a frequency converter circuit where multipliers or divisors are changeable sequentially and repeatedly by a control circuit, and the signal thus converted with respect to its frequency is fed to one processing circuit, whose output signal is then selected and discriminated by the use of a control signal synchronized with such change of the multipliers or divisors in the frequency converter circuit, thereby producing a signal representative of the frequency of the signal being inputted. Due to such arrangement, it becomes possible to use in common the processing circuit comprising a band-pass filter, a level detector and a rectifier.

Although various minor modifications may be suggested by those versed in the art, it should be understood that I wish to embody within the scope of the patent warranted hereon, all such embodiments as reasonably and properly come within the scope of my contribution to the art.

What is claimed is:

1. A signal processing apparatus comprising:
   (a) a first frequency converter circuit for multiplying or dividing the frequency of an input signal;
   (b) a first control circuit connected with said first frequency converter circuit for producing a first control signal for sequentially and repeatedly changing multipliers or divisors in said first converter circuit;
   (c) a first processing circuit connecting with said first control circuit and having a first band-pass filter for permitting passage of a signal of a predetermined frequency alone, and a first rectifier for rectifying and smoothing the output signal of said first frequency converter circuit after passage of said signal through said first bandpass filter;
   (d) a selector circuit connected with said first processing circuit and said first control circuit and responsive to both the output signal of said first processing circuit and said first control signal for producing a signal representative of the frequency of the signal being inputted to said first frequency converter circuit;
   (e) a second control circuit connected with said selector circuit for producing a second control signal in accordance with the output signal of said selector circuit;
   (f) a second frequency converter circuit for multiplying or dividing the frequency of the input signal which is fed thereto in parallel relation to said first frequency converter circuit, said second frequency converter circuit being connected with said second control circuit and having multipliers or divisors which are selectively changeable by said second control signal;
   (g) a second processing circuit connected with said second control circuit and having a second band-pass filter for permitting passage of a signal of a predetermined frequency alone, and a second rectifier for rectifying and smoothing the output signal of said second frequency converter circuit after passage of said signal through said second band-pass filer; and
   (h) a discriminator circuit connected with said selector circuit and said second processing circuit for evaluating the output signal of said selector circuit by using the output signals of said second processing circuit and said selector circuit.

2. A signal processing apparatus according to claim 1, said individual multipliers or divisors in said frequency converter circuit corresponding respectively to the frequencies of signals to be processed, and having proper numeral values each selected so as to convert the corresponding frequency of the input signal into a frequency permitted to pass through said band-pass filter.

3. A signal processing apparatus according to claim 1, said selector circuit comprising a plurality of latch circuits corresponding respectively to the frequencies of signals to be processed, each latch circuit serving to latch the output signal of said processing circuit by the use of said control signal.

4. A signal processing apparatus according to claim 1, said individual multipliers or divisors in said second converter circuit corresponding respectively to the frequencies of signals to be processed, and having proper numeral values each so selected as to convert the corresponding frequency of the input signal into a frequency permitted to pass through said band-pass filter in said second processing circuit.

5. A signal processing apparatus according to claim 1, said frequency converter circuit having functions of writing the input signal in a random access memory after conversion of said signal into a digital form, subsequently reading out the written signal at a speed conforming to said control signal, and converting the read signal into an analog form.

* * * * *